(12) United States Patent
Dibattista et al.

(10) Patent No.: US 9,632,109 B2
(45) Date of Patent: Apr. 25, 2017

(54) METHODS, APPARATUS, AND SYSTEMS FOR CONTACTING SEMICONDUCTOR DIES THAT ARE ELECTRICALLY COUPLED TO TEST ACCESS INTERFACE POSITIONED IN SCRIBE LINES OF A WAFER

(75) Inventors: Larry John Dibattista, Cupertino, CA (US); Duncan Packard Gurley, Cupertino, CA (US)

(73) Assignee: ADVANTEST CORPORATION, Tokyo (JP)

( * ) Notice: Subject to any disclaimer, the term of this patent is extended or adjusted under 35 U.S.C. 154(b) by 784 days.

(21) Appl. No.: 14/005,311

(22) PCT Filed: Jun. 30, 2011

(86) PCT No.: PCT/US2011/042680
§ 371 (c)(1),
(2), (4) Date: Sep. 16, 2013

(87) PCT Pub. No.: WO2013/002806
PCT Pub. Date: Jan. 3, 2013

(65) Prior Publication Data
US 2014/0002122 A1    Jan. 2, 2014

(51) Int. Cl.
| G01R 31/26 | (2014.01) |
| G01R 1/067 | (2006.01) |
| G01R 1/04 | (2006.01) |
| G01R 31/3185 | (2006.01) |
| H01L 21/66 | (2006.01) |
| G06F 17/50 | (2006.01) |

(52) U.S. Cl.
CPC .... *G01R 1/0491* (2013.01); *G01R 31/318511* (2013.01); *G06F 17/5072* (2013.01); *H01L 22/32* (2013.01); *H01L 2224/16* (2013.01); *H01L 2924/1461* (2013.01)

(58) Field of Classification Search
CPC .. G01R 15/202; G01R 1/06794; G01R 23/02; G01R 31/2623; G01R 31/2601; G01R 33/09; G01R 33/093; G01R 33/098; G01R 31/025; G01R 31/2621
USPC ......... 324/750.24, 252, 762.01, 762.05, 719, 324/71.5, 765, 760.02, 762.08–762.09, 324/763.01, 757.02, 750.03, 754
See application file for complete search history.

(56) References Cited

U.S. PATENT DOCUMENTS

| 6,399,400 B1 | 6/2002 | Osann, Jr. |
| 7,714,443 B2 | 5/2010 | Chen |
| (Continued) | | |

FOREIGN PATENT DOCUMENTS

JP    2004111539    4/2004

*Primary Examiner* — Patrick Assouad
*Assistant Examiner* — Taqi Nasir

(57) ABSTRACT

A semiconductor device includes a first wafer having i) a plurality of semiconductor dies, ii) a plurality of scribe lines adjacent one or more of the semiconductor dies, iii) a test access interface positioned in one or more of the scribe lines, wherein the test access interface has a first plurality of through-substrate conductors with a standardized physical layout, and iv) electrical couplings between at least some of the through-substrate conductors and at least one of the semiconductor dies. Methods, apparatus and systems for testing this and other types of semiconductor devices are also disclosed.

19 Claims, 15 Drawing Sheets

(56) References Cited

U.S. PATENT DOCUMENTS

| | | | | |
|---|---|---|---|---|
| 2010/0073018 A1* | 3/2010 | Ruppelt | ............ | G01R 1/06788 324/755.01 |
| 2010/0289064 A1* | 11/2010 | Or-Bach | ........... | H01L 21/26506 257/209 |
| 2011/0049728 A1 | 3/2011 | Pagani | | |
| 2014/0002121 A1* | 1/2014 | Khoche | .................. | H01L 22/14 324/750.3 |

* cited by examiner

METHODS, APPARATUS, AND SYSTEMS FOR CONTACTING SEMICONDUCTOR DIES THAT ARE ELECTRICALLY COUPLED TO TEST ACCESS INTERFACE POSITIONED IN SCRIBE LINES OF A WAFER

BACKGROUND

The testing of semiconductor die on a wafer is becoming increasingly difficult. Testing is complicated by factors such as increases in transistor density, increases in signal input/output (I/O) demands, decreases in semiconductor the size, and more limited I/O access. These limitations become particularly apparent when testing die with high speed or high bandwidth interfaces, such as die having Gigahertz (GHz) range radio frequency (RF), Bluetooth, 3G, 4G, Global Systems Mobile (GSM), analog, analog mixed signal (AMS), Digital Television (DTV), 5.1 Audio, digital, test access port (TAP), High Definition Multimedia Interface (HDMI), Peripheral Component Interconnect (PCI)e, Universal Serial Bus (USB)x, Digital Visual Interface (DVI), high speed input/output (HSIO) interfaces, WiFi, Wireless Local Area Network (WLAN), and clock distribution circuits.

Probing solutions using micro electro-mechanical systems (MEMS), needles, and non-contact probes have limitations when used to probe the afore-mentioned types of interfaces. Also, additional costs are incurred as a result of the unique signal mappings that are required to map the pins of a probing solution to the pin layout of an I/O interface that has been adapted for use in a particular application.

Improved methods, apparatus and systems for testing semiconductor die with the above and other types of interfaces would be useful.

BRIEF DESCRIPTION OF THE DRAWINGS

Illustrative embodiments of the invention are illustrated in the drawings, in which.

DETAILED DESCRIPTION

Figure 1:
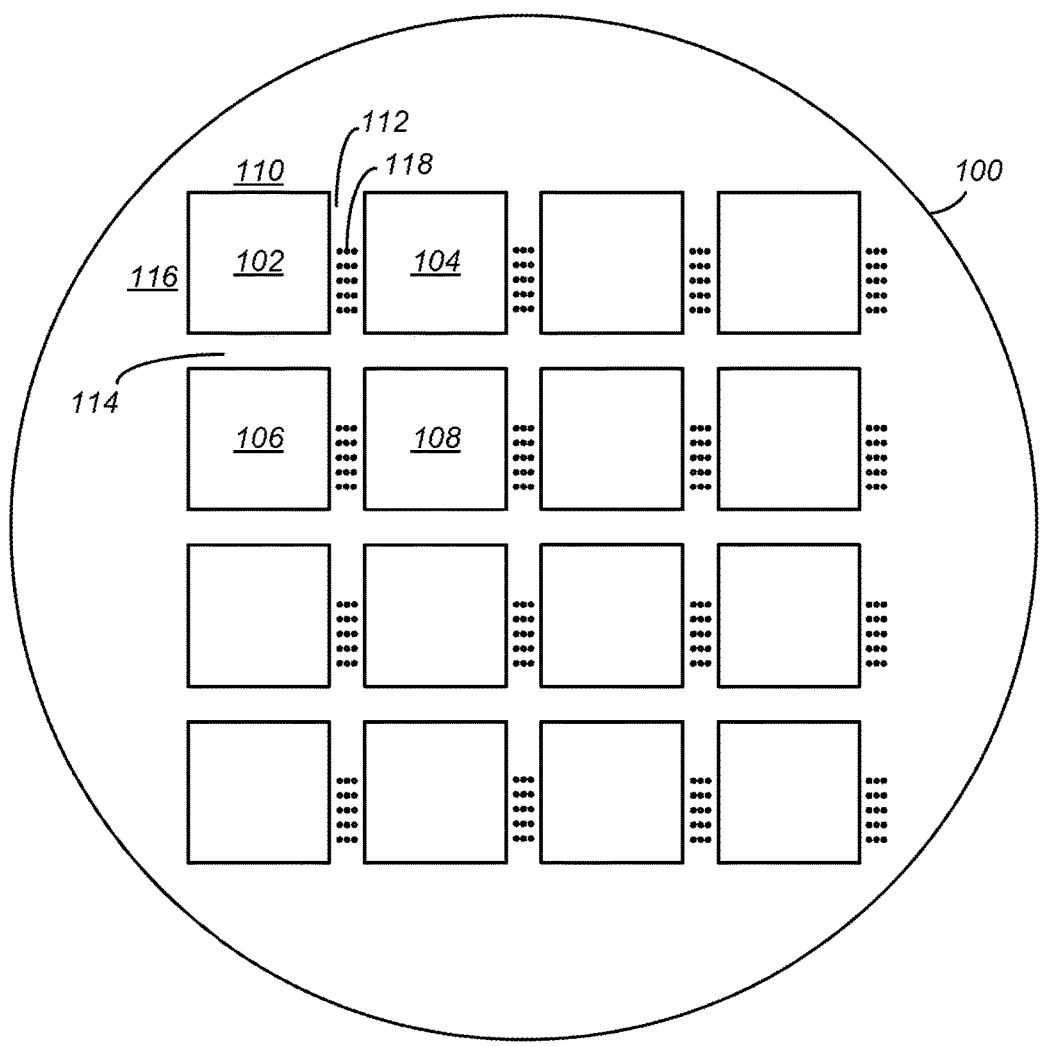
FIG. 1 provides a plan view of a wafer having sixteen semiconductor dies and corresponding scribe line test access interfaces.

FIG. 1 provides a plan view of a wafer 100 having sixteen semiconductor dies (e.g., dies 102, 104, 106, 108). Each of the semiconductor dies 102, 104, 106, 108 is bordered by a number of scribe lines (e.g., 110, 112, 114, 116). For purposes of this description, a "semiconductor die" is defined to be a portion of a wafer on which a functional circuit is fabricated, and a "scribe line" is defined to be any portion of a wafer adjacent a semiconductor die, which portion of the wafer may be scribed or cut as a semiconductor die is diced from the wafer. Typically, the number of die on a wafer would be much greater than sixteen, and each die would cover a much smaller fraction of the wafer's surface area. However, the arrangement of dies 102, 104, 106, 108 shown in FIG. 1 is useful for the purpose of describing certain aspects of a novel wafer design.

In FIG. 1, an I/O interface of each die (such as die 102) is coupled to a respective test access interface (e.g., test access interface 118) in one of the scribe lines (e.g., scribe line 112). However, it is envisioned that in alternate wafer embodiments, such as embodiments where a wafer carries more than one type of die, test access interfaces 118 might be coupled to only particular ones of the dies 102.

Figure 2:
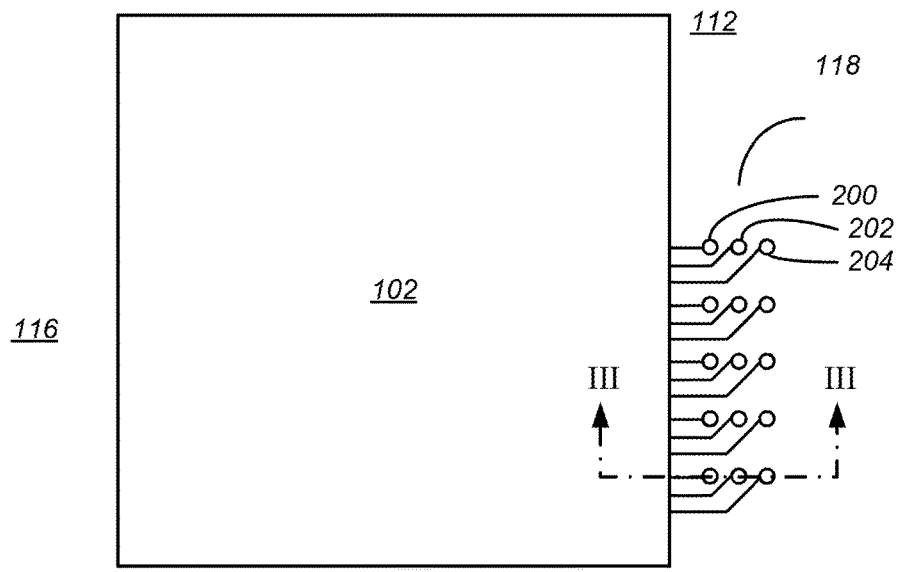
FIG. 2 provides an exploded plan view of one of the semiconductor dies and test access interfaces shown in FIG. 1.
Figure 3:
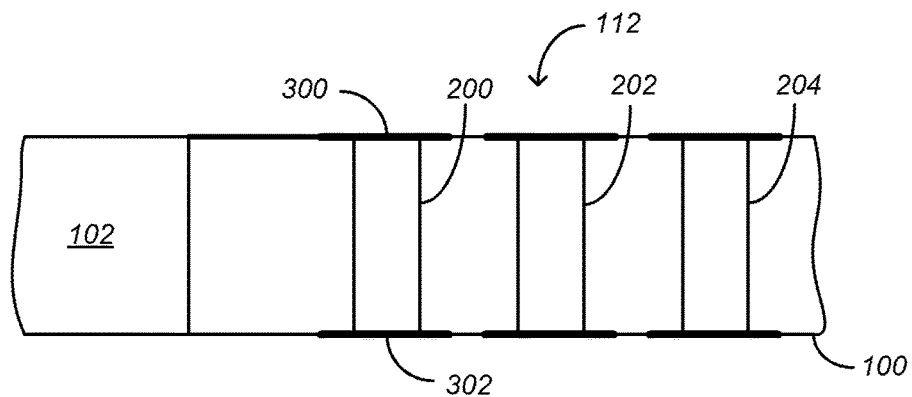
FIG. 3 illustrates an exemplary elevation of a row of the TSVs shown in FIG. 2.

FIG. 2 provides an exploded plan view of one of the semiconductor dies 102 and test access interfaces 118 shown in FIG. 1. The test access interface 118 comprises a plurality of through-silicon vias (TSVs, such as TSVs 200, 202, 204). The TSVs 200, 202, 204 may be formed, for example, using the method described in U.S. Pat. No. 7,683,459 B2. FIG. 3 illustrates an exemplary elevation of a row of the TSVs 200, 202, 204 shown in FIG. 2. Optionally, the top and bottom of each TSV 200, 202, 204 may be bounded by a conductive pad or solder (see, e.g., pads 300, 302 bounding TSV 200). The pad or solder may be used to electrically couple the TSV to a corresponding TSV in another wafer or chip (e.g., to form a stacked die device). A plurality of conductive traces or other electrical couplings couple respective ones of the TSVs 200, 202, 204 to the semiconductor the 102. Using currently known methods for forming TSVs, each TSV may have a diameter as small as 1-5 micrometers (μm), and a group of TSVs may be formed at a pitch of 5-10 μm. However, these diameters and pitches are only examples and are not intended to be limiting. As a whole, different combinations of die size, scribe line width, and methods of TSV formation enable different numbers of TSVs 200, 202, 204 to be formed in a scribe line 112.

Some or all of the TSVs 200, 202, 204 in a test access interface 118 are coupled to the pads, contacts or nodes of a die 102. In the case of the test access interface 118 shown in FIG. 2, each TSV 200, 202, 204 of the test access interface 118 is coupled to a different pad or contact of the die 102. However in other cases, two or more TSVs may be coupled to the same pad, contact or node of a die, or a single TSV may be coupled to two or more pads, contacts or nodes of a die. For example, to improve the integrity of signals transmitted over a particular signal line 400 of the test access interface, the signal line may be ground-shielded (e.g., bordered or surrounded) by multiple TSV ground lines 402, 404. See, for example, the portion of the test access interface 118 shown in FIG. 4. The TSV ground lines 402, 404 may be joined at a pad, contact or node 406 of the die 102, or by traces or ground planes formed in the scribe line. Alternately, or additionally, the TSV ground lines may be joined by traces or other electrical connections provided by a wafer translator, probe card or probe head that contacts the test access interface 118 when the die 102 is tested. Shielding so close to a die 102 can improve testing performance and mitigate power surging and other impediments to signal integrity. It can also improve the quality of, for example: production validation testing (PVT) for known good die; die speed/error correction; pilot signal training of RF structures; and self-calibration of advanced analog-to-digital and digital-to-analog converters (ADC/DAC).

Figure 4:
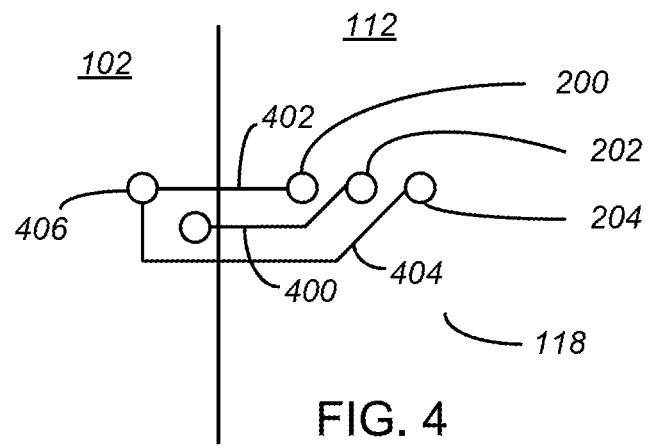
FIG. 4 illustrates a scribe line test access interface having a ground-shielded TSV.

In contrast to pads formed on one side of a wafer, the TSVs 200, 202, 204 shown in FIGS. 2-4 may be contacted from either (or both) sides of a wafer 100, thereby improving accessibility for purposes of testing and other non-mission activities.

Figure 5:
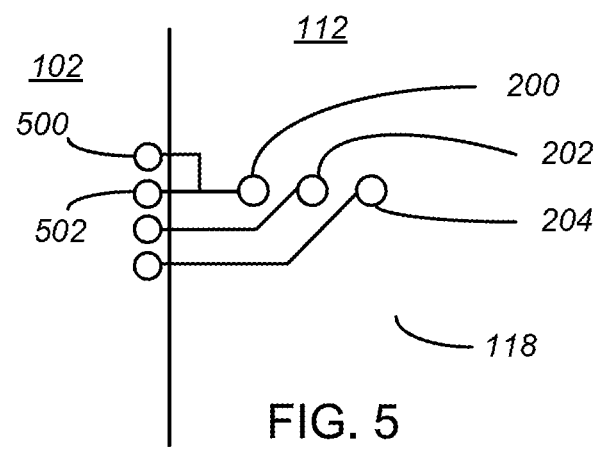
FIG. 5 illustrates a test access interface wherein a single TSV is coupled to multiple pads of a die.

FIG. 5 illustrates a test access interface 118 wherein a single TSV 200 is coupled to multiple pads 500, 502 of a the 102. The test access interface connections shown in FIG. 5 are useful where it is desirable to fan-out or fan-in signals (including, for example, power or ground signals) close to a die 102.

Figure 6:
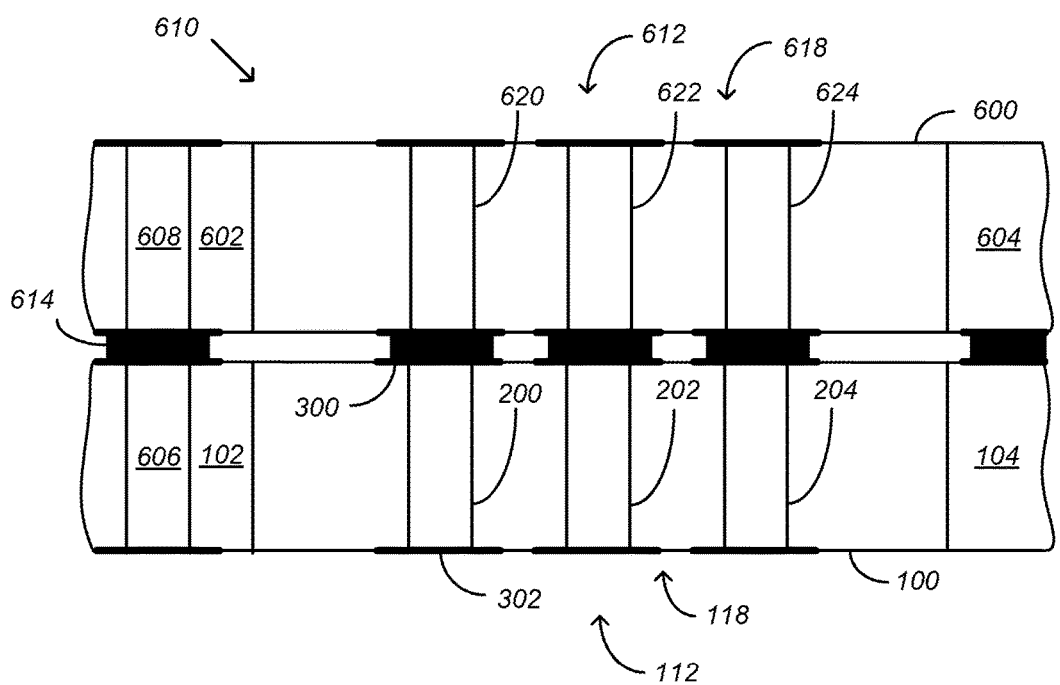
FIG. 6 illustrates an elevation of s and second stacked wafers forming a stacked die device.

In some cases, chips or wafers may be stacked to form three-dimensional stacked semiconductor devices. For example, FIG. 6 illustrates an elevation of first and second stacked wafers 100, 600 forming a stacked die device 610. One or both of the wafers may contain known good die. By way of example, the wafers 100, 600 are stacked using a wafer-to-wafer (W2W) stacking process. Corresponding dies (e.g., 102 and 602, or 104 and 604) of the first and second wafers 100, 600 are electrically coupled by means of electrical couplings between a first number of TSVs (e.g., TSVs 606, 608). By way of example, the TSVs 606, 608 may be electrically coupled using solder or a conductive adhesive 614. Similarly, corresponding test access interfaces 118, 618 in scribe lines 112, 612 adjacent the dies 102, 104, 602 604 are electrically coupled by means of electrical couplings between a second number of TSVs 200, 202, 204, 620, 622, 624. In this manner, power, ground and test signals applied to a TSV of one of the test access interfaces 618 can be fanned out to a TSV of the other test access interface 118—and ultimately, to both of the dies 102, 602. Or, in the case of individually addressable dies, signals applied to either one of the test access interfaces 118, 618 can be received and acted upon by an addressed one of the dies 102, 602. Signals can also be transmitted from either or both of the dies 102, 602 to an external tester—either sequentially or in parallel. The external tester may be coupled to either or both of the test access interfaces 118, 618.

In the above and other ways, electrically coupled TSVs of two or more test access interfaces can function as lines of a test interface bus. If desired, additional wafers may be stacked on the wafers 100, 600 shown in FIG. 6, and TSVs of additional test access interfaces may be coupled to the TSVs 200, 202, 204, 620, 622, 624 of the test access interfaces 118, 618 shown in FIG. 6.

Figure 7:
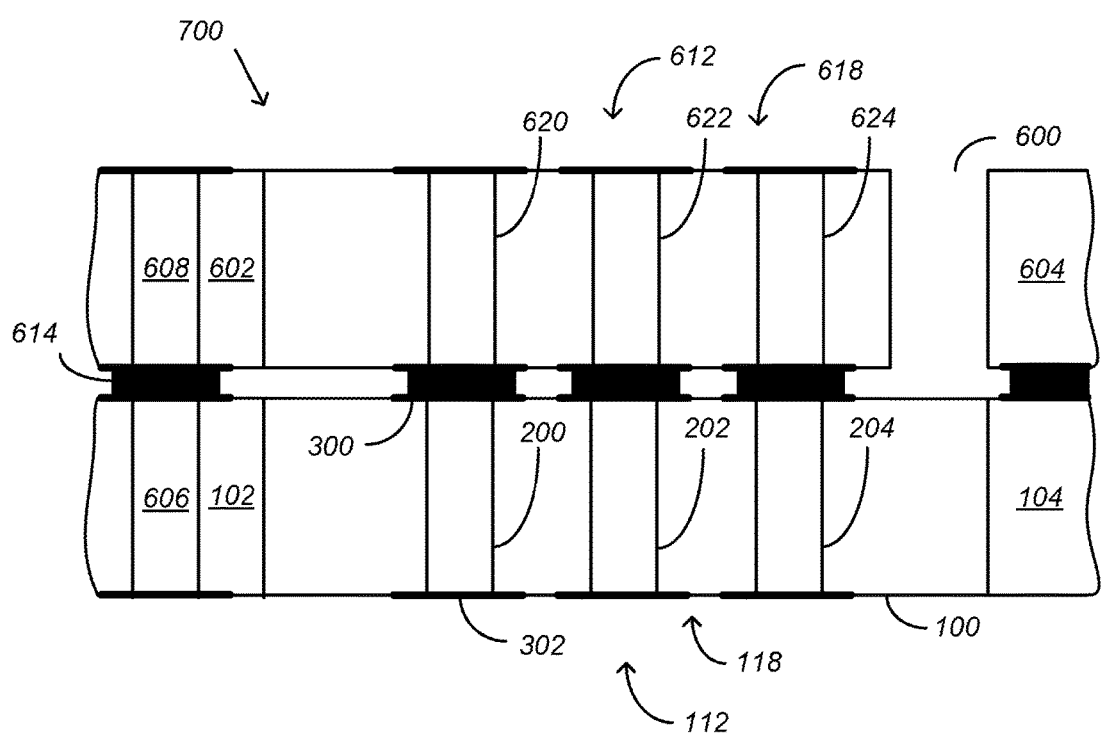
FIG. 7 illustrates an elevation of a stacked die device including dies that have been joined to a wafer using a chip-to-wafer (C2W) stacking process.

FIG. 7 illustrates an elevation of a stacked the device 700 including dies 602, 604 that have been joined to a wafer 100 using a chip-to-wafer (C2W) stacking process. In some cases, the chips or the wafer (or both) may contain known good dies. In the embodiment shown, the dies 602, 604 have been singulated from a wafer along with their test access interfaces (e.g., interface 618 remains attached to the 602), such that corresponding dies 102, 602 and test access interfaces 118, 618 can be electrically coupled as described with respect to the dies and test access interfaces of the stacked wafers shown in FIG. 6. In other embodiments (not shown), dies without scribe fine test access interfaces can be stacked on dies with scribe fine test access interfaces (or vice versa). In still other embodiments, any set of one or more semiconductor die can be cut from a wafer and stacked on the semiconductor die of another wafer.

In any of the embodiments described in the preceding paragraph, a test access interface coupled to only one or a subset of stacked dies may be used to apply test signals to the test structures or nodes of one die, and by means of inter-die electrical couplings (e.g., solder 614 and TSVs 606, 608), the test structures or nodes of the one die can be used to apply test signals to test structures or nodes of another die.

Figure 8:
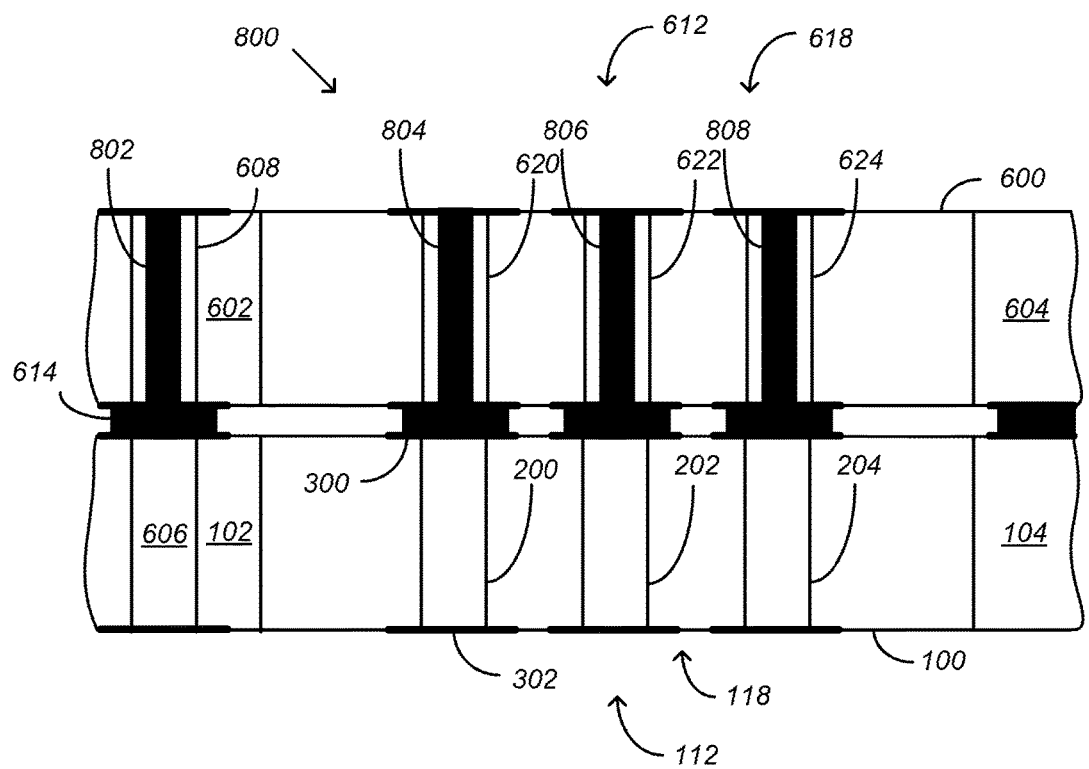
FIG. 8 illustrates an elevation of a stacked die device including first and second stacked wafers coupled by through-silicon pillars.

In some cases, some or all of the TSVs shown in FIGS. 1-7 may be alternately replaced with other forms of through-substrate conductors. For example, FIG. 8 illustrates an elevation of a stacked die device 800 including first and second stacked wafers 100, 600 coupled by through-silicon pillars (TSPs) 802, 804, 806, 808. By way of example, the TSPs 802, 804, 806, 808 may be formed, and the dies 102, 602 and test access interfaces 118, 618 of stacked wafers 100, 600 or chips may be electrically coupled, as described in European Patent Application Publication EP 2 075 828 A1.

Regardless of whether dies and their test access interfaces are stacked using a W2W or C2W stacking process, and regardless of what type of through-substrate conductor is used to electrically couple the stacked dies and their test access interfaces, the stacked dies may be tested by contacting a test access interface on either side of the stacked die device.

After the test access interfaces shown in FIGS. 1-8 are used to test their corresponding dies or stacked die devices (which are collectively referred to herein as semiconductor devices), the test access interfaces may be separated from their corresponding semiconductor devices. Separation may be achieved by, for example: 1) electrically opening switches that couple the test access interfaces to their corresponding die; 2) blowing fuses that couple the test access interfaces to their corresponding die; or 3) physically cutting the test access interfaces from their corresponding die using tools such as a saw or a laser. In some cases, however, the test access interfaces may remain coupled to their corresponding semiconductor devices.

A person of ordinary skill in the art, having read this disclosure, will understand that a test access interface may be provided for any collection of power, ground or test signals that need to be applied to (or received from) a die or device under test (each of which is referred to herein as a DUT). However, in some cases, it can be useful to specify one or more test access interfaces having standardized physical layouts, with each standardized test access interface having a particular physical and functional arrangement of conductors. In this manner, designers of semiconductor dies or wafers, and designers of test equipment and interfaces therefor, may rely on a certain degree of compatibility without one or the other needing to custom design their dies, wafers, interfaces or test equipment from the ground up. This not only reduces cost, but reduces time-to-test and time-to-market.

Figure 9:
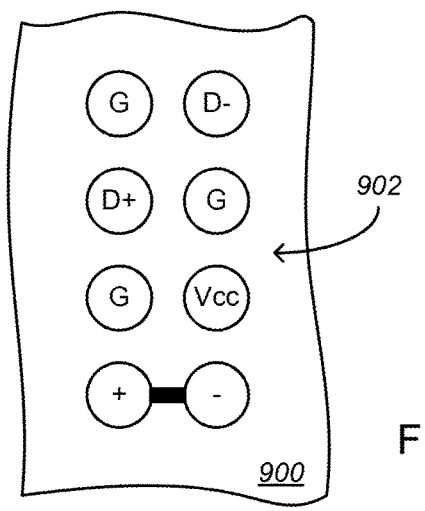
FIG. 9 provides a plan view of a standardized physical layout for a universal serial bus (USB) test access interface.

By way of example, FIG. 9 provides a plan view of a standardized physical layout for a universal serial bus (USB) test access interface 900. Per the USB specification, the USB test access interface comprises positive and negative data lines (D+, D−), a voltage supply line (Vcc), and a ground line (G). However, to improve signal integrity, the test access interface 900 is provided with a total of three ground lines. The multiple ground lines help to reduce crosstalk between the data and voltage supply lines. The test access interface 900 further comprises a pair of shorted TSVs, labeled "+" and "−". The shorted TSVs can be used to align the probes of a probe head or other test interface with the test access interface (as will be described in more detail later in this description).

Figure 10:
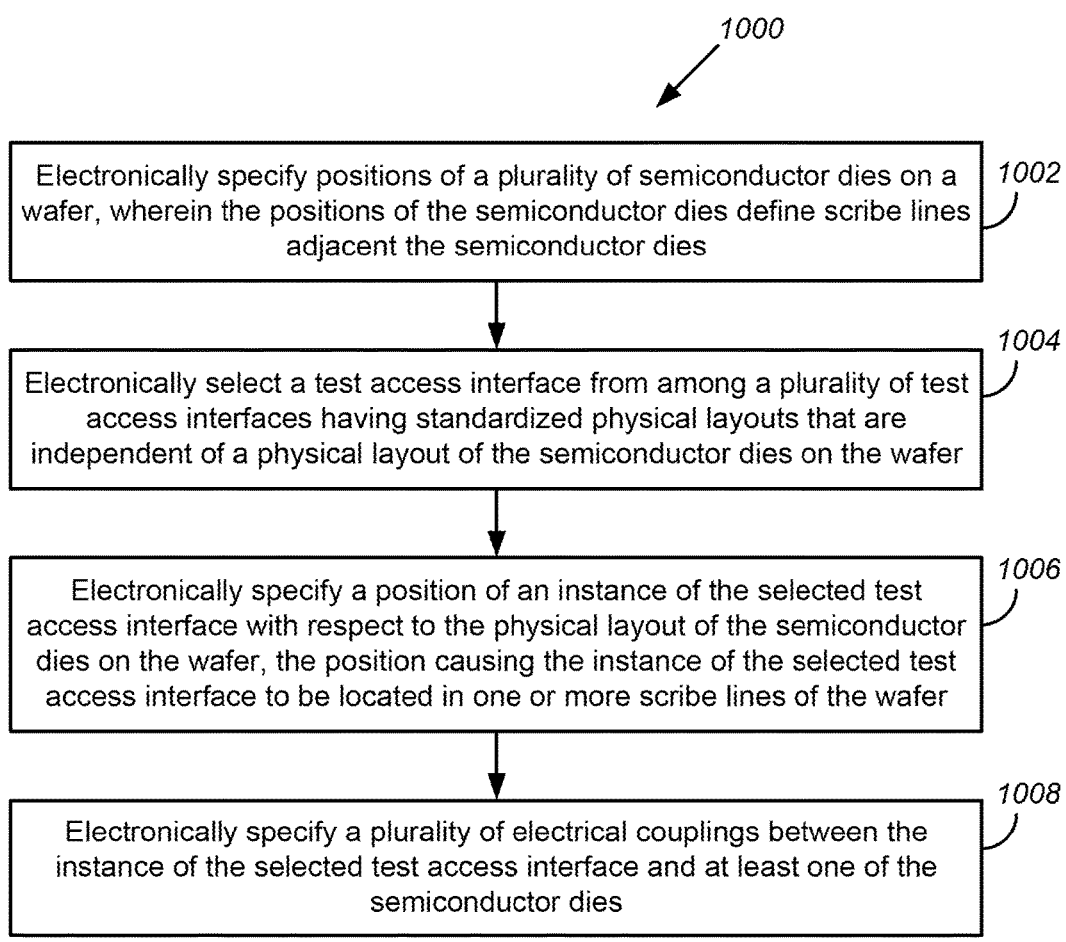
FIG. 10 illustrates a new method for laying out elements on a wafer.

Given the above-noted usefulness of standardization, FIG. 10 illustrates a new method 1000 for laying out elements on a wafer. At block 1002, positions of a plurality of semiconductor dies on the wafer are electronically specified. The positions of the dies define a plurality of scribe lines adjacent the dies. At block 1004, a test access interface is electronically selected from among a plurality of test access interfaces. The selected test access interface has a standardized physical layout that is independent of the physical layout of the dies. At block 1006, a position of an instance of the selected test access interface is specified with respect to the physical layout of the plurality of dies on the wafer. The position causes the instance of the selected test access interface to be located in one or more of the plurality of scribe lines. At block 1008, a plurality of electrical couplings between the instance of the selected test access interface and at least one of the dies is electronically specified. The order of the steps 1002, 1004, 1006 and 1008 is not critical, except where dictated by the above description.

Although the method 1000 has been described in the context of positioning and electrically coupling a single instance of a selected test access interface with respect to the physical layout of dies on a semiconductor wafer, additional instances of the selected test access interface will typically be positioned with respect to the physical layout of the dies, such that every the of the same type is positioned adjacent (and is electrically coupled to) a separate instance of the selected test access interface. Each instance of a test access interface is positioned in one or more of the wafer's scribe lines.

In some embodiments of the method, multiple ones of the test access interfaces may be selected, and the positions of one or more instances of each selected test access interface may be electronically specified with respect to the physical layout of the dies. Again, each instance of a test access interface is positioned in one of the wafer's scribe lines. When a plurality of test access interfaces are coupled to a single die, the test access interfaces may positioned in the same or different scribe lines.

It is noted that different ones of the plurality of test access interfaces may have different standardized physical layouts. In some cases, the standardized physical layout of a test access interface may occupy a large enough area that, in a particular application, it must be positioned in a scribe line between two dies by itself (i.e., without other test access interfaces being placed in the same scribe line). In other cases, the standardized physical layout of a test access interface may be compact enough that it can be positioned in a scribe line along with one or more other test access interfaces.

The method 1000 may be performed using a computer having a processor and a physical storage media, wherein the processor retrieves and executes instructions embodying the method 1000. The method may be performed automatically by the computer, in response to electronic descriptions of the semiconductor dies, semiconductor wafer, and the test access interface(s), and rules for combining same; or, the method may be performed in response to other electronically stored information from which information about the semiconductor dies, wafer and test access interface(s) can be derived or inferred. The method 1000 may also be performed semi-automatically, in response to preferences or approvals of the computer's user.

The method 1000 is useful in that it may be used to lay out elements on different kinds of semiconductor wafers, with each wafer having a potentially different type (or types) of semiconductor dies connected to a potentially different set of one or more test access interfaces having standardized physical layouts. Because each type of test access interface maintains the same physical layout across different semiconductor wafers, the task of designing a wafer-specific probe card, translator or probe head is simplified. In fact, in some cases, a wafer-specific probe card, translator or probe head may not need to be designed at all. For example, and as will be described in more detail later in this description, a tester may be provided with a probe head that carries a limited set of probes, which probes are laid out in accord with the standardized physical layout(s) of one or more test access interfaces. Such a probe head may be walked across a semiconductor wafer under control of a test program that 1) specifies the locations of test access interfaces on a wafer, and 2) programs a control system to move the probe head or wafer so as to sequentially align the probes of the probe head with the contacts of different ones of the test access interfaces.

The method 1000 is also useful in that placement of standardized test access interfaces in the scribe lines of a wafer can mitigate or eliminate the need to provide probe targets within the boundaries of the wafer's die.

Having described various exemplary semiconductor wafers, and a variety of different test access interfaces that may be incorporated therein, a variety of wafer translators, probe cards and probe heads for contacting such test access interfaces will now be described. Related methods of contacting such test access interfaces (and thereby, a plurality of semiconductor devices) will also be described.

Figure 11:
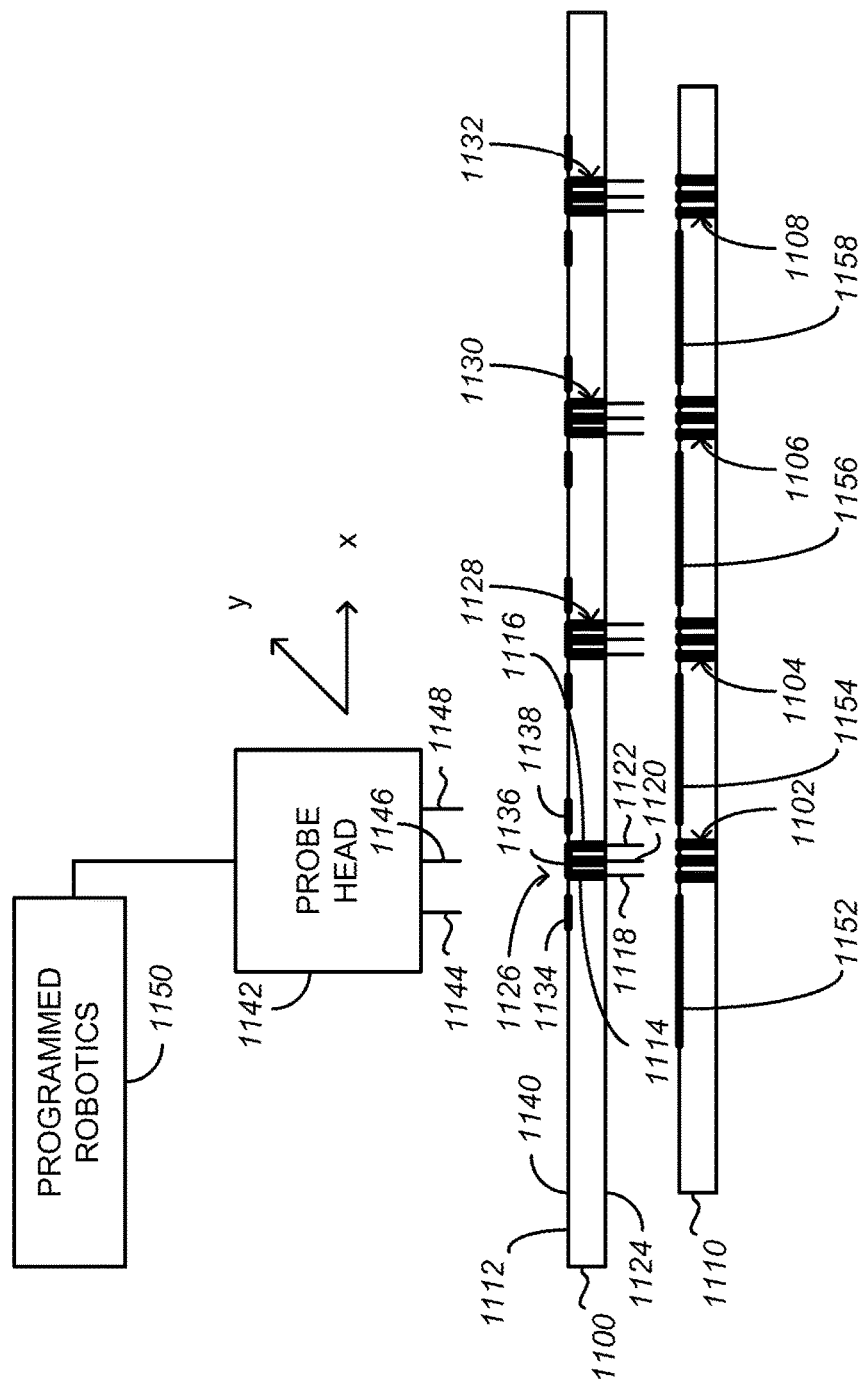
FIG. 11 illustrates a cross-section of a wafer translator for contacting the test access interfaces of a semiconductor wafer.

FIG. 11 illustrates a cross-section of a wafer translator 1100 for contacting the test access interfaces 1102, 1104, 1106, 1108 of a semiconductor wafer 1110. By way of example, the wafer translator 1100 comprises a substrate 1112 formed of a semiconductor material such as silicon. The substrate 1112 has a plurality of through-substrate conductors such as TSVs 1114, 1116 formed therein. Each of the TSVs 1114, 1116 terminates at a conductive pad on the lower surface of the wafer translator (i.e., the surface of the translator abutting the wafer). Conductive pillars 1118, 1120, 1122 extend from the conductive pads and provide a plurality of probes. Alternately, the conductive pillars 1118, 1120, 1122 could be replaced with solder bumps or other conductive features, or the conductive pillars 1118, 1120, 1122 could be eliminated in favor of conductive pads with a greater standoff from the lower surface 1124 of the wafer translator 1100. In still other embodiments, the conductive pillars 1118, 1120, 1122 or other conductive features could be coupled directly to the TSVs 1114, 1116, without using the conductive pads. Alternately, through-silicon pillars such as those shown in FIG. 8 could extend from the surface 1124 of the wafer translator 1100 and provide a plurality of probes.

The TSVs 1114, 1116 and conductive pillars 1118, 1120, 1122 are arranged in groups or sets 1126, 1128, 1130, 1132 corresponding to the standardized physical layouts of the test access interfaces 1102, 1104, 1106, 1108 provided on the wafer 1110. Each group 1126, 1128, 1130, 1132 has a position with respect to the substrate 1112 (i.e., is positioned on the substrate 1112) such that it corresponds to a position of at least one scribe line on the wafer 1110.

Preferably, the TSVs 1114, 1116 and conductive pillars 1118, 1120, 1122 have a uniform pitch, both within each group of TSVs 1114, 1116 or conductive pillars 1118, 1120, 1122, 1108, and between different groups 1126, 1128, 1130, 1132 of TSVs or conductive pillars.

Each of the TSVs 1114, 1116 is electrically coupled to a corresponding electrical contact (e.g., pad 1134, 1136 or 1138) on the upper surface 1140 of the wafer translator 1100. The TSVs 1114, 1116 may be coupled to the pads 1134, 1136, 1138 by way of a redistribution layer having signal traces or other elements. The redistribution layer may be formed on the upper surface 1140 of the wafer translator 1100.

The pads 1134, 1136, 1138 on the upper surface 1140 preferably have a uniform pitch, which pitch is preferably greater than the pitch of the pillars 1118, 1120, 1122 and pads on the lower surface 1124 of the wafer translator 1100. For each group of pads 1134, 1136, 1138 on the upper surface 1140 of the wafer translator 1100, which group of pads 1134, 1136, 1138 corresponds to a particular set of pillars 1118, 1120, 1122 and test access interface 1102, the group of pads 1134, 1136, 1138 on the upper surface 1140 of the wafer translator 1100 may also have a standardized physical layout.

The pads 1134, 1136, 1138 on the upper surface 1140 of the wafer translator 1100 are contacted by a probe head 1142. The probe head 1142 may comprise an array of probes 1144, 1146, 1148 that corresponds to one or a subset of the standardized physical layout(s) of the test access interfaces 1102, 1104, 1106, 1108. For example, a probe head 1142 may comprise an array of probes 1144, 1146, 1148 corresponding to only a single test access interface 1102. Or, for example, a probe head may comprise probes corresponding to some or all of the test access interfaces servicing one or more semiconductor die; or some or all of the test access interfaces in one or more scribe lines of a semiconductor wafer 1110. Or, by way of further example, a probe head may comprise arrays of probes corresponding to all of the test access interfaces within a particular region (or over an entire surface) of a semiconductor wafer 1110.

To test the dies 1152, 1154, 1156, 1158 on a semiconductor wafer 1110, the wafer translator 1100 is aligned to and contacted by the probe head 1142 (or vice versa), and the semiconductor wafer 1110 is aligned to and contacted by the wafer translator 1100 (or vice versa). Programmed robotics 1150 then move the probe head 1142 (via x, y movements) to the pads 1134, 1136, 1138 corresponding to respective test access interfaces 1102, 1104, 1106, 1108 (or sets of test access interfaces) on the semiconductor wafer 1110.

Because of the greater pitch of the pads 1134, 1136, 1138 as compared to the pitch of the TSVs 1114, 1116 and pillars 1118, 1120, 1122, the wafer translator 1100 is typically easier to align to the probe head 1142 than is the wafer 1110 to the wafer translator 1100. In some cases, the wafer 1110 may be aligned to the wafer translator 1100 (or vice versa) using a DC continuity loopback test through paired TSVs or other through-substrate conductors. Paired TSVs may be formed, for example, by electrically coupling TSVs in the wafer 1110 to electrical traces (e.g., bridges or fuses) formed on the wafer 1110, or on a wafer carrier that is attached to the wafer 1110. See, for example, FIGS. 9 & 12.

Figure 12:
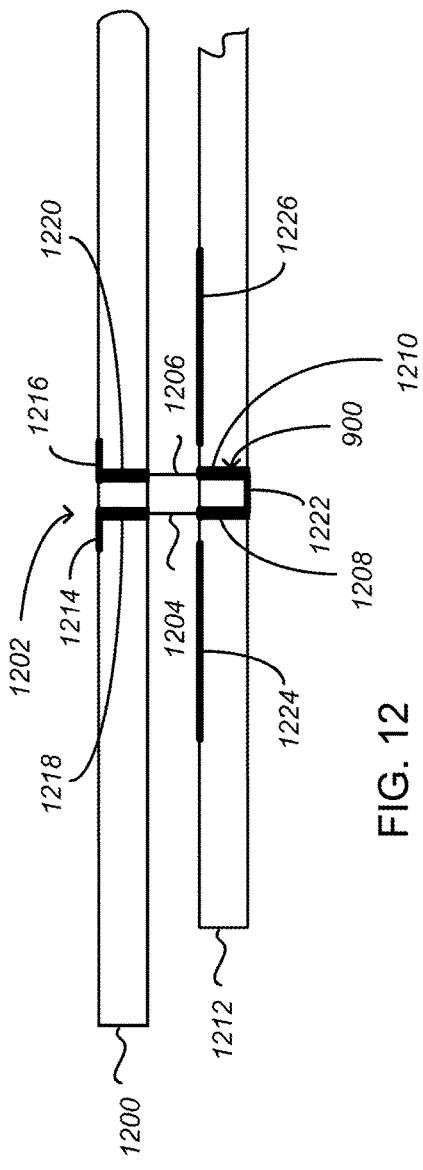
FIG. 12 illustrates a portion of a wafer translator having a group of probes that touch down on the USB test access interface shown in FIG. 9 (and particularly, the DC continuity TSVs of the USB test access interface shown in FIG. 9)
Figure 13:
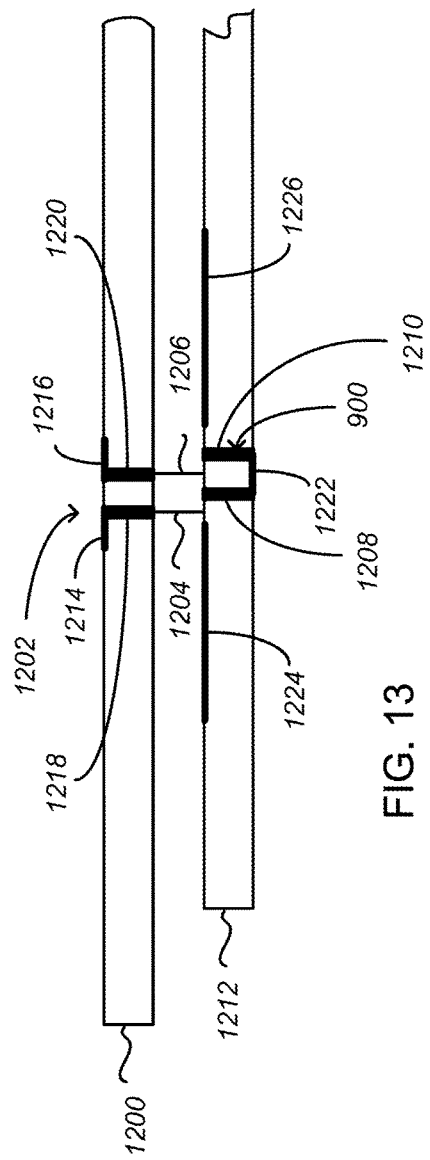
FIG. 13 illustrates misalignment of the wafer translator and wafer shown in FIG. 12.

FIG. 9 provides an example of a standardized physical layout for a USB test access interface 900. As shown, the interface 900 has a shorted pair of TSVs labeled "+" and "−". FIG. 12 illustrates a portion of a wafer translator 1200 having a group 1202 of probes 1204, 1206 that touch down on the USB test access interface 900 (and particularly, the DC continuity TSVs 1208, 1210 of the USB test access interface 900). In this manner, alignment of the wafer translator 1200 and wafer 1212 can be verified by checking the electrical continuity between pads 1214 and 1216 (e.g., through TSV 1218, probe 1204, TSV 1208, electrical trace or bridge 1222, TSV 1210, probe 1206, and TSV 1220). If the wafer translator 1200 and wafer 1112 are misaligned, as shown in FIG. 13, there will be no or poor electrical continuity between the pads 1214 and 1216. In some cases, multiple pairs of shorted TSVs may be provided on the wafer 1212. In this manner, the wafer translator 1200 and wafer 1212 can be aligned more precisely—particularly with respect to rotational alignment. Multiple pairs of shorted TSVs may be provided, for example, as: 1) part of a single test access interface, 2) across two or more test access interfaces, or 3) apart from any test access interface. The pairs of shorted TSVs (or other through-substrate conductors) are ideally formed in a wafer's scribe lines, or in other regions of a wafer that are external to the wafer's the 1224, 1226.

Figure 14:
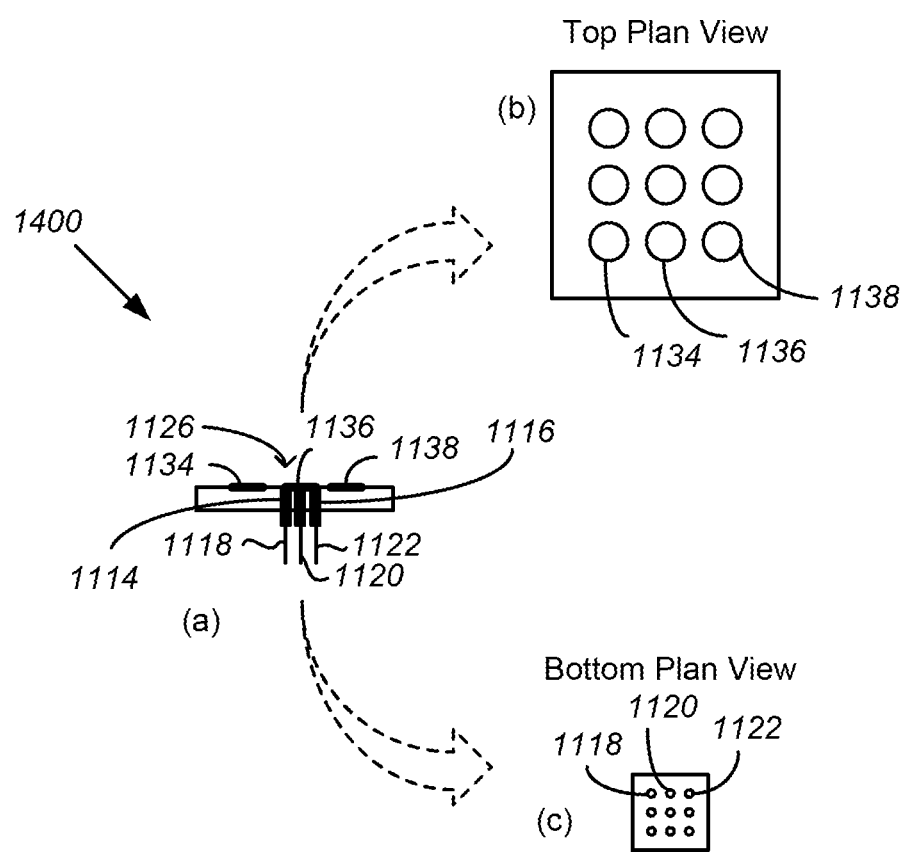
FIG. 14 illustrates an exemplary pre-designed brick used in the design and construction of the wafer translator shown in FIG. 11.

Because the test access interfaces 1102, 1104, 1106, 1108 of the wafer 1110 (FIG. 11) have standardized physical layouts, the wafer translator 1100 may be constructed from pre-designed "bricks" that define the physical layout of the conductive pillars 1118, 1120, 1122, TSVs or other conductive features that mate with the test access interfaces. The bricks may also define the physical layouts of the electrical contacts (e.g., pads 1134, 1136, 1138) that are contacted by the probe head 1142, and the physical layouts of any electrical couplings (e.g., TSVs 1114, 1116 and redistribution layer traces) between the conductive pillars 1118, 1120, 1122 and the pads 1134, 1136, 1138. An exemplary pre-designed brick 1400 used in the design and construction of the wafer translator 1100 is shown in FIG. 14. The brick is shown in elevation (FIG. 14(*a*)), in a top plan view (FIG. 14(*b*)), and in a bottom plan view (FIG. 14(*c*)). In some cases, the brick or bricks from which a wafer translator is formed may exist only in the design stage (e.g., as electronic descriptions stored on a computer readable medium), and after the bricks are electronically positioned in a wafer translator design, the wafer translator can be built as a single unit where the physical bricks are inseparable from the wafer translator as a whole. In other cases, the bricks may be or comprise one or more physically discrete components 1504, 1506, 1508, 1510, such as silicon or other types of substrates 1502 having conductive features (e.g., probes 1512, 1514, 1516) extending therefrom. See, FIG. 15. In the case of physically discrete components 1504, 1506, 1508, 1510 having substrates 1502 with conductive features 1512, 1514, 15T16 extending therefrom, the substrates 1502 of the physically discrete components 1504, 1506, 1508, 1510 may be arranged on a common supporting substrate 1500. The substrates 1500 and 1502 may be made from the same or different materials, and in some cases may be made from (or comprise) semiconductor, ceramic or printed circuit board material.

The probes 1512, 1514, 1516 of the physically discrete components 1504, 1506, 1508, 1510 may be coupled to pads on the supporting substrate 1500 using, for example, wire bonding or surface mounting techniques. The apparatus shown in FIG. 15 may otherwise be constructed similarly to the apparatus shown in FIG. 11.

For purposes of this description, a space transformer or translator apparatus having probes extending therefrom is considered a "probe card", regardless of whether the probes of the translator apparatus are formed on a common substrate, or on substrates that are attached to a common substrate. A wafer translator is a form of space transformer or translator apparatus where all of the probes of the translator apparatus are formed on a common substrate. Thus, FIGS. 11 and 15 both illustrate probe cards 1100, 1500, but FIG. 11 is the only one of these figures that illustrates a wafer translator. The phrase "probe card" is intended to encompass not only wafer translators, but also devices such as silicon frames or silicon interposers.

Figure 15:
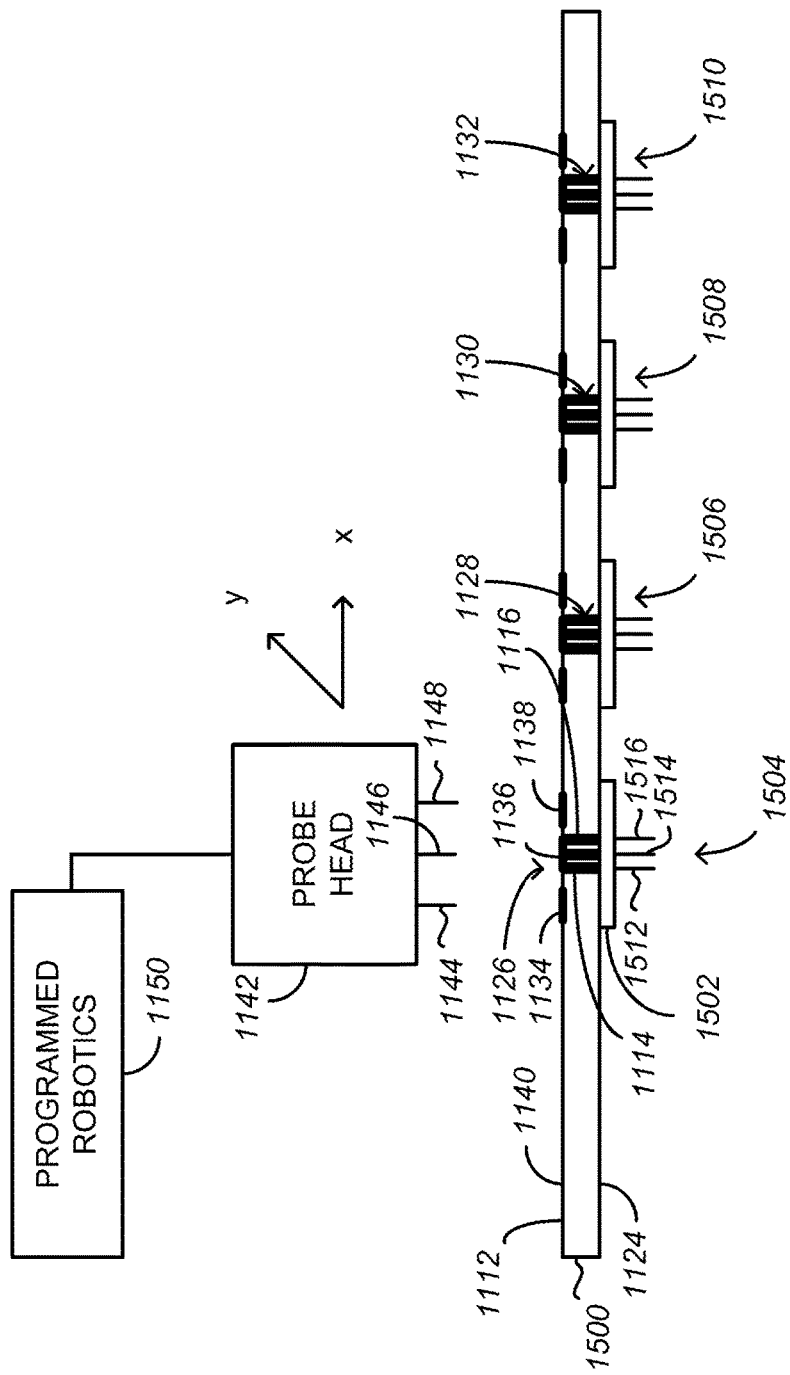
FIG. 15 illustrates an exemplary pre-designed brick having separate substrates carrying probe sets.

Regardless of whether a test system comprises the translator apparatus shown in FIG. 11 or FIG. 15, or a similar form of translator apparatus having test access interfaces with standardized physical layouts, the cost of the system is concentrated in the reusable probe head, and not in the cost of the application-specific wafer translator or probe card. The systems shown in FIGS. 11 & 15 therefore work well with shuttle mixed wafer designs (which are commonly used in early process development).

Figure 16:
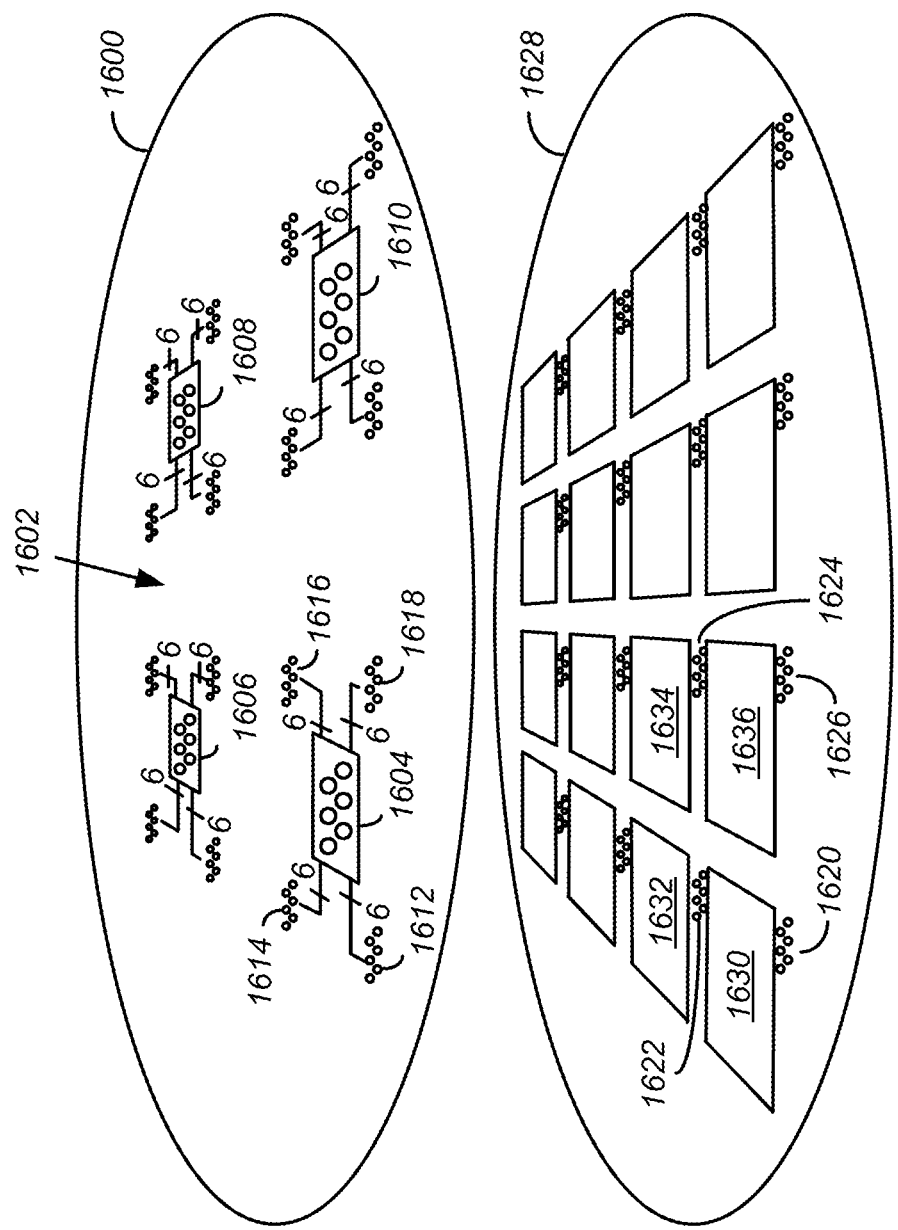
FIG. 16 illustrates a wafer translator having a switching matrix formed thereon.

FIG. 16 illustrates a modification to the wafer translator shown in FIG. 11. In particular, the wafer translator 1600, shown in FIG. 16, has a switching matrix 1602 formed thereon. By way of example, the switching matrix 1602 has four switching circuits 1604 1606, 1608, 1610, each of which is coupled to different groups of through-silicon conductors and probes 1612, 1614, 1616, 1618. Each switching circuit 1604, 1606, 1608, 1610 may be operated in parallel by means of signals received from a test system, such that test system resources are sequentially made available to each of the test access interfaces 1620, 1622, 1624, 1626 to which the groups of probes 1612, 1614, 1616, 1618 on the wafer translator are connected. If desired, the switching circuits 1604, 1606, 1608, 1610 may also be configured to provide a fan-out of test system signals to, or a fan-in of test signal responses from, multiple ones or all of the test access interfaces 1620, 1622, 1624, 1626 to which the switching circuit is connected.

In some cases, a probe head may contact each of the switching circuits 1604, 1606, 1608, 1610 sequentially. In other cases, a probe head may be configured to contact and operate all of the switching circuits 1604, 1606, 1608, 1610 in parallel.

Because the configuration of the switching matrix 1602 is dependent on the unique layout of test access interfaces 1620, 1622, 1624, 1626 on a wafer 1628, the wafer translator 1600 shown in FIG. 16 typically takes longer to design than the wafer translator shown in FIG. 11. The switching matrix 1602 also increases the required time and cost to build the wafer translator 1600. However, the wafer translator 1600 with switching matrix 1602 is useful in that it reduces or eliminates probe head indexing time and enables multisite testing of the semiconductor die 1630, 1632, 1634, 1636. In some cases, the switching matrix 1602 may be designed to provide one touchdown wafer testing. "One touchdown wafer testing" means that a probe head need only touch down on a wafer translator 1600 or probe card once. Connections to the different test access interfaces 1620, 1622, 1624, 1626 on a wafer 1628 are then made by operating the switching matrix 1602 instead of re-indexing the probe head. Fewer (or one) touchdown wafer testing can be achieved by increasing the number of probe sets on a probe head or coupling all of a wafer translator's probe groups to a single switching circuit (versus the four switching circuits 1604, 1606, 1608, 1610 shown in FIG. 16).

By way of example, the switching matrix 1602 may be implemented using switches formed directly on the wafer translator 1600, or switches formed in integrated circuits that are electrically coupled to the wafer translator 1600. In some embodiments, the switching matrix 1602 may be replaced or supplemented with other passive or active circuit components. To allow for shorter probe lengths on the underside of the wafer translator 1600 (i.e., short probes for contacting the wafer 1628), the switching circuits 1604, 1606, 1608, 1610 may be formed on, or attached to, the surface of the wafer translator 1600 opposite the surface that faces the wafer 1628.

Other than the addition of the switching matrix 1602, the wafer translator 1600 shown in FIG. 16 may be constructed similarly to the wafer translator shown in FIG. 11. For example, the wafer translator 1600 may include through-substrate conductors from which conductive pillars, solder bumps or other conductive features extend, such that the conductive pillars provide a plurality of probes for contacting the semiconductor dies 1630, 1632, 1634, 1636 on the wafer 1628. It will be understood by a person of ordinary skill in the art that the wafer translator 1600 is only exemplary, and that the inventive principles disclosed in FIG. 16 can be readily applied to other types of probe cards.

Figure 17:
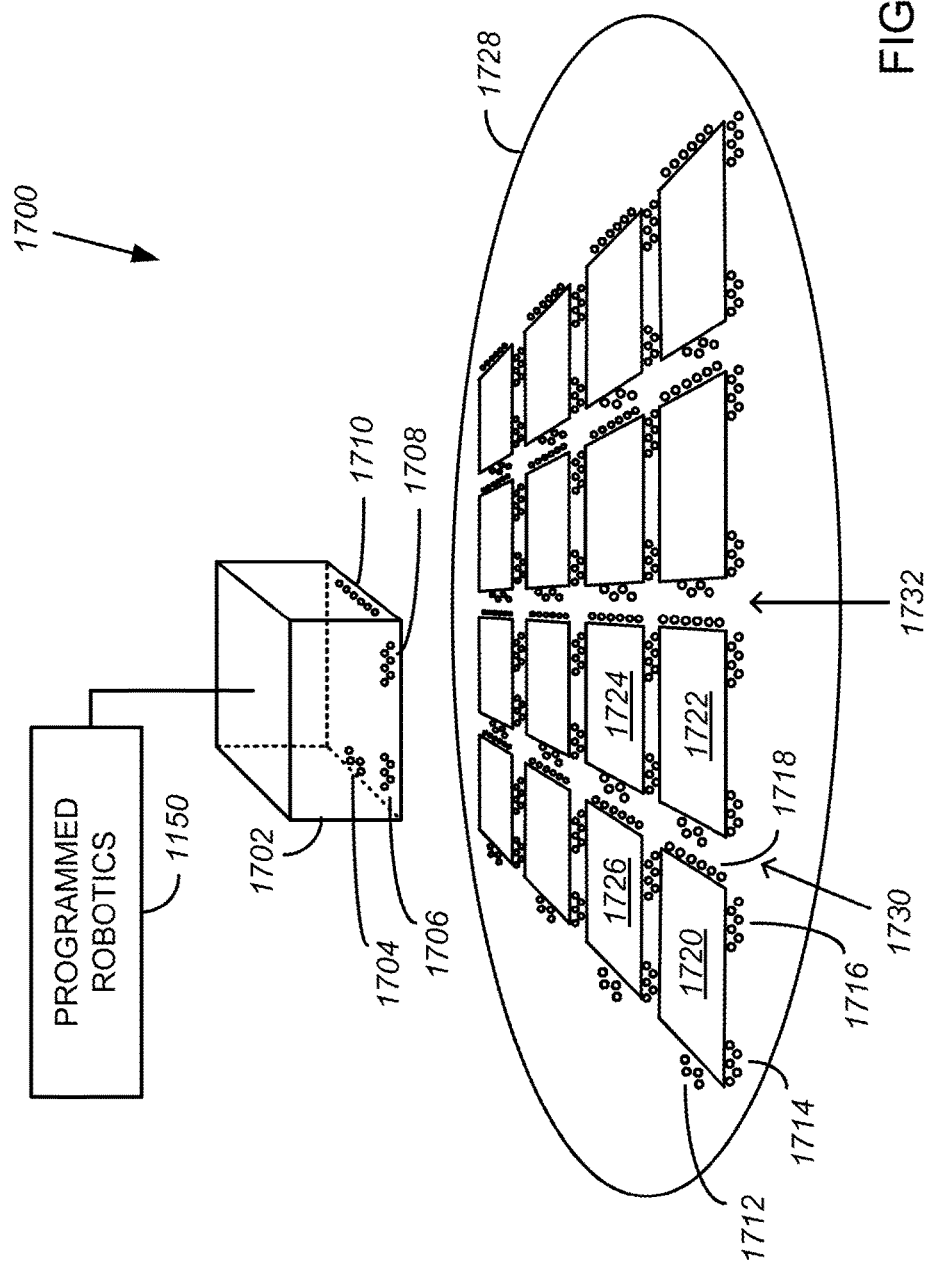
FIG. 17 illustrates yet another system for testing a wafer having scribe line test access interfaces with standardized physical layouts.

FIG. 17 illustrates yet another system for testing a wafer having scribe line test access interfaces with standardized physical layouts. The system 1700 eliminates any wafer translator or probe card, and instead incorporates a probe head 1702 for directly probing a wafer 1700. The probe head 1702 may comprise any number of probe sets, each of which has a standardized physical layout corresponding to the standardized physical layout of a test access interface. By way of example, the probe head 1702 has four probe sets 1704, 1706, 1708, 1710, each of which has a standardized physical layout for interfacing with a respective test access interface 1712, 1714, 1716, 1718 on a wafer 1728. By way of example, the probe head 1702 is shown to have probe sets 1704, 1706, 1708, 1710 for interfacing with the test access interfaces 1712, 1714, 1716, 1718 corresponding to a single semiconductor the 1720. However, the probe head 1702 could alternately be configured, for example, to interface with: 1) some or all of the test access interfaces corresponding to multiple semiconductor dies 1720, 1722, 1724, 1726; 2) some or all of the test access interfaces in one or more scribe lines 1730, 1732 of a semiconductor wafer 1110; 3) some or all of the test access interfaces within a particular region of the semiconductor wafer 1728 (e.g., all of the test access interfaces coupled to an X×Y arrangement of dies); or 4) all of the test access interfaces on an entire surface of the semiconductor wafer 1728. Alternately, the probe sets coupled to a probe head may be arranged in a generic manner, such that a particular touchdown of the probe head enables alignment and use of only one or some of the probe sets at a time.

Figure 18:
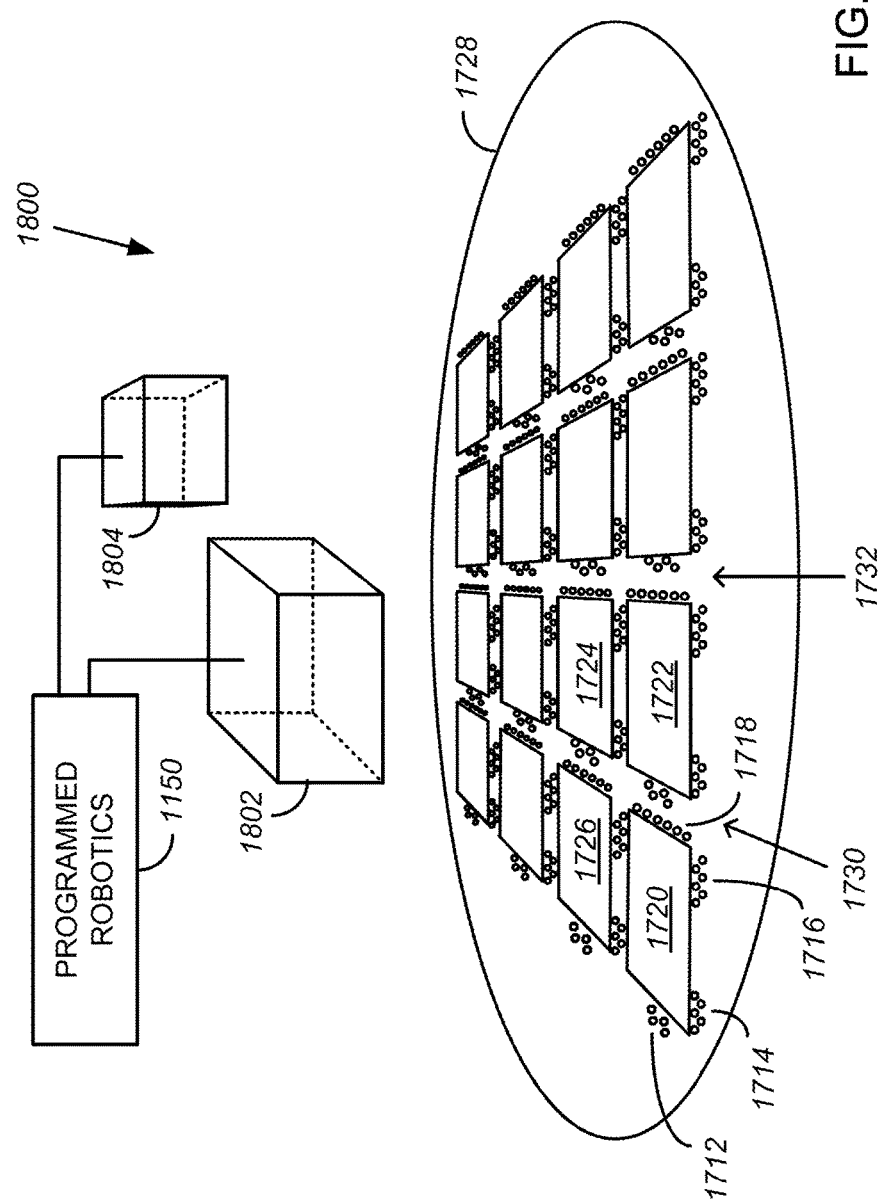
FIG. 18 illustrates a test system having multiple probe heads.

In yet another configuration, a test system 1800 (FIG. 18) may comprise multiple probe heads 1802, 1804, each of which carries a single or multiple probe sets and is fixed or independently maneuverable with respect to other probe heads. Although only two probe heads 1802, 1804 are shown in FIG. 18, any number of probe heads may be included in a test system 1800. With multiple probe heads 1802, 1804, each probe head 1802, 1804 may be provided with a different type of test access interface, which in some cases can make the probe heads 1802, 1804 usable with respect to more and varied arrangements of standardized test access interfaces on different wafers. Regardless, programmed robotics 1150 may be used to move the one or more probe heads 1802, 1804 to different positions with respect to the wafer 1728.

Figure 19:
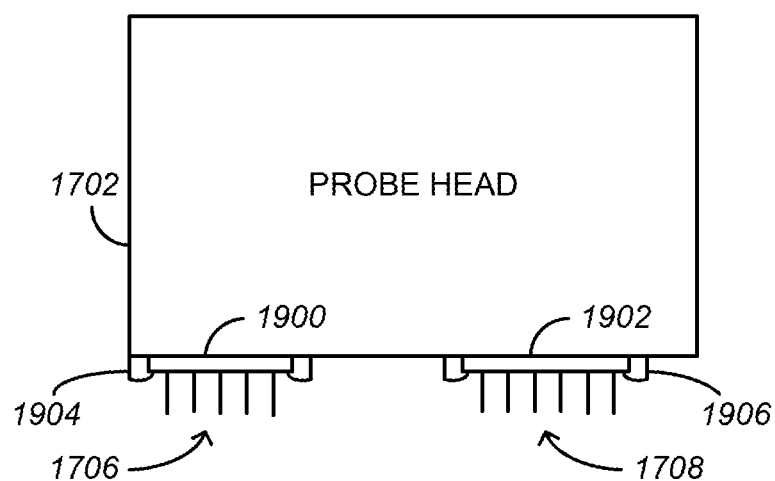
FIG. 19 illustrates a probe head having probe sets that are removably attached to the probe head.

In some cases, the probe sets 1704, 1706, 1708, 1710 may be removably attached to the probe head 1702, in an arrangement that corresponds to test access interfaces 1712, 1714, 1716, 1718 included in one or more scribe lines of a particular wafer under test 1728. In these embodiments, each probe set may be constructed on a small substrate (e.g., 1900 or 1902; FIG. 19) that is formed similarly to the substrate 1112 of the wafer translator shown in FIG. 11. However, each substrate 1900, 1902 may be limited to one or a small number of probe sets 1706, 1708, and may be attached to the probe head 1702 via a connector (e.g., 1904 or 1906), solder, adhesive, or other means (e.g., a vacuum). In this manner, the probe head 1702 may be configured in an application-specific manner.

The probes of each probe set may be provided, for example, by conductive elements (such as conductive pillars or solder bumps) that extend from through-substrate conductors in a semiconductor substrate.

To test a wafer 1728, the probe head 1702 shown in FIG. 17 may be aligned to the wafer under test 1728, and then walked across the test access interfaces of the wafer 1728 using programmed robotics 1050. In the case of multiple probe heads 1802, 1804 (FIG. 18), which probe heads 1802, 1804 may have different probe sets included thereon, the probe heads 1802, 1804 may be individually walked across corresponding test access interfaces—either sequentially (where one probe head is walked after the other), or in parallel (where multiple probe heads walk different paths).

Any of the test systems, wafer translators, probe cards or probe heads described herein may be used or configured to test stacked dies (such as dies stacked using a W2W or C2W stacking process). In some cases, the stacked dies may be accessed via test access interfaces on either side of a stacked die structure. See, for example, the stacked dies shown in FIGS. 6-8. And, if the test access interfaces corresponding to stacked dies are electrically coupled, all of the dies in a stack may be tested by contacting only one of the test access interfaces. In such cases, like dies may be tested in parallel, or like or different dies may be tested one at a time using a die addressing scheme.

It is contemplated that test access interfaces having standardized physical layouts may take various forms. However, standardized physical layouts are believed to be especially useful for interfaces where high speed of operation or signal integrity is a concern. I/O interfaces that can benefit from being coupled to a test access interface as shown and described herein include, but are not limited to, the following interfaces: radio frequency (RF) interfaces, audio interfaces, video interfaces, analog mixed signal (AMS) interfaces, or high-speed serial interfaces. More specifically, I/O interfaces that can benefit from being coupled to a test access interface as shown and described herein include, but are not limited to, the following interfaces: Gigahertz (GHz) range radio frequency (RF), Bluetooth, 3G, 4G, Global Systems Mobile (GSM), analog, analog mixed signal (AMS), Digital Television (DTV), 5.1 Audio, digital, test access port (TAP), High Definition Multimedia Interface (HDMI), Peripheral Component Interconnect (PCI)e, Universal Serial Bus (USB)x, Digital Visual Interface (DVI), high speed input/output (HSIO), WiFi, Wireless Local Area Network (WLAN), I2C, Serial Peripheral Interface Bus (SPI), Mobile Industry Processor Interface (MIR), Double Data Rate 3 (DDR3), small outline dual in-line memory module (SO-DIMM), Joint Test Action Group (JTAG), DPS, and clock distribution circuits.

The methods, apparatus and systems disclosed herein are useful not only because they provide for standardization of test access interfaces, but because they enable a test interface (e.g., wafer translator, probe card or probe head) to be designed and built more quickly, thereby reducing "time to test". They also reduce the capital expense of application-specific tester-to-DUT interfaces.

What is claimed is:

1. A device, comprising:
 a first wafer having i) a first plurality of semiconductor dies, ii) a first plurality of scribe lines, each of the first plurality of scribe lines adjacent one or more of the first plurality of semiconductor dies, iii) a first test access interface positioned in one or more of the first plurality of scribe lines, the first test access interface having a first plurality of through-substrate conductors with a standardized physical layout, wherein the through-substrate conductors comprise a ground line and a signal line, and iv) electrical couplings between at least some of the first plurality of through-substrate conductors and at least one of the first plurality of semiconductor dies.

2. The device of claim 1, further comprising:
 a second wafer stacked on the first wafer, the second wafer having i) a second plurality of semiconductor dies, ii) a second plurality of scribe lines, each of the second plurality of scribe ones adjacent one or more of the second plurality of semiconductor dies, iii) a second test access interface positioned in one or more of the second plurality of scribe lines, the second test access interface having a second plurality of through-substrate conductors with the standardized physical layout, and iv) electrical couplings between at least some of the second plurality of through-substrate conductors and at least one of the second plurality of dies; and
 electrical couplings between the first test access interface and the second test access interface.

3. The device of claim 1, further comprising:
 a substrate having i) a set of one or more semiconductor die cut from a second wafer, ii) a set of one or more scribe lines, each of the set of one or more scribe lines adjacent at least one semiconductor the in the set of one or more semiconductor dies, iii) a second test access interface positioned in one or more of the set of one or more scribe lines, the second test access interface having a second plurality of through-substrate conductors with the standardized physical layout, and iv) electrical couplings between at least some of the second plurality of through-substrate conductors and at least one of the set of one or more semiconductor dies; and
 electrical couplings between the first test access interface and the second test access interface.

4. The device of claim 1, further comprising:
a second plurality of semiconductor dies, the second plurality of semiconductor dies being known good dies; and
electrical couplings between the first plurality of semiconductor dies and the second plurality of semiconductor dies.

5. The device of claim 1, wherein the plurality of through-substrate conductors comprises through-silicon vias (TSVs).

6. A method for laying out elements on a wafer, comprising: using a computer,
electronically specifying positions of a plurality of semiconductor dies on the wafer, the positions of the semiconductor dies defining scribe lines adjacent the semiconductor dies;
electronically selecting a test access interface from among a plurality of test access interfaces, the selected test access interface having a standardized physical layout that is independent of a physical layout of the semiconductor dies on the wafer;
electronically specifying a position of an instance of the selected test access interface with respect to the physical layout of the semiconductor dies on the wafer, the position causing the instance of the selected test access interface to be located in one or more of the scribe lines; and
electronically specifying a plurality of electrical couplings between the instance of the selected test access interface and at least one of the semiconductor dies.

7. The method of claim 6, wherein the electronically selected test access interface is selected from the group consisting of: a radio frequency (RF) interface, an audio interface, a video interface, an analog mixed signal interface, and a high-speed serial interface.

8. The method of claim 6, wherein the standardized physical layout of the selected test access interface defines a ground-shielded signal line.

9. Apparatus for contacting semiconductor dies during semiconductor test, the apparatus comprising:
a substrate having a first surface, a second surface opposite the first surface, a plurality of through-substrate conductors extending between the first surface and the second surface, a redistribution layer on the second surface and having electrical connections to the through-substrate conductors, and a plurality of probe sets coupled to the first surface, wherein each probe set has a standardized physical layout for contacting a corresponding scribe line test access interface on a wafer, each of the plurality of probe sets has a position with respect to the first substrate corresponding to a position of at least one scribe line on the wafer, and each of a number of probes in the probe sets is coupled to a respective one of the through-substrate conductors.

10. The apparatus of claim 9, wherein each probe set is part of a pre-designed brick, wherein the pre-designed brick dictates i) a placement of electrical contacts on the second surface of the substrate, and ii) electrical couplings between the through-substrate conductors and the electrical contacts by way of the redistribution layer.

11. The apparatus of claim 10, further comprising:
a probe head having probes for contacting a set of the electrical contacts corresponding to at least one of the probe sets; and
programmed robotics for moving the probe head in contact with the set of the electrical contacts.

12. The apparatus of claim 9, further comprising a switching matrix on the substrate, the switching matrix coupled to two or more of the probe sets by way of the through-semiconductor conductors and the redistribution layer.

13. The apparatus of claim 9, wherein the probe sets comprise through-silicon pillars.

14. The apparatus of claim 9, further comprising:
a plurality of second substrates, wherein each of the second substrates has a first surface, a second surface, and at least one of the probe sets extending from the first surface, wherein each of the second substrates is coupled to the first substrate with the second surface of the second substrate facing the first surface of the first substrate.

15. The apparatus of claim 9, further comprising:
electrical contacts on the second surface of the first substrate;
electrical couplings between the through-substrate conductors and the electrical contacts by way of the redistribution layer;
a probe head having probes for contacting a set of the electrical contacts corresponding to at least one of the probe sets; and
programmed robotics for moving the probe head in contact with the set of the electrical contacts.

16. The apparatus of claim 14, further comprising a switching matrix on the first substrate, the switching matrix coupled to two or more of the probe sets by way of the through-semiconductor conductors and the redistribution layer.

17. The apparatus of claim 14, wherein the probe sets comprise through-silicon pillars.

18. A method for contacting semiconductor dies during semiconductor test, the method comprising:
providing a wafer having a plurality of semiconductor dies, a plurality of scribe lines, and at least one test access interface, wherein each of the at least one test access interface has a plurality of through-substrate conductors that are electrically coupled to at least one of the semiconductor dies, and wherein the wafer has at least one pair of through-substrate conductors that are electrically coupled;
contacting the wafer with a space transformer having a substrate having a first surface, a second surface opposite the first surface, a plurality of through-substrate conductors extending between the first surface and the second surface, a first pad on the second surface connected to the through-substrate conductors, a redistribution layer on the second surface and having an electrical connection that connects a second pad on the second surface to the through-substrate conductors, the first pad and the second pad for contacting a probe head, and at least one probe set for contacting one or more of the at least one test access interface; and
verifying an alignment between the at least one probe set and the one or more of the at least one test access interface by performing a DC continuity loopback test using at least one pair of probes extending from the space transformer and the at least one pair of through-substrate conductors that are electrically coupled.

19. Apparatus for contacting semiconductor dies during semiconductor test, the apparatus comprising:
a plurality of probe heads, each of the probe heads having at least one probe set with a standardized physical layout for contacting a plurality of through-semiconductor conductors in a corresponding scribe line test access interface on a wafer, each of the probe heads individually controlled by programmed robotics to contact a respective test access interface on the wafer.

* * * * *